(12) United States Patent
Furubayashi et al.

(10) Patent No.: US 7,858,206 B2
(45) Date of Patent: Dec. 28, 2010

(54) TRANSPARENT CONDUCTOR, TRANSPARENT ELECTRODE, SOLAR CELL, LIGHT EMITTING DEVICE AND DISPLAY PANEL

(75) Inventors: Yutaka Furubayashi, Kawasaki (JP); Tetsuya Hasegawa, Tokorozawa (JP); Taro Hitosugi, Yamato (JP)

(73) Assignee: Kanagawa Academy of Science and Technology, Kanagawa-ken (JP)

( * ) Notice: Subject to any disclaimer, the term of this patent is extended or adjusted under 35 U.S.C. 154(b) by 185 days.

(21) Appl. No.: 11/573,678

(22) PCT Filed: Aug. 10, 2005

(86) PCT No.: PCT/JP2005/014660

§ 371 (c)(1),
(2), (4) Date: Jul. 24, 2007

(87) PCT Pub. No.: WO2006/016608

PCT Pub. Date: Feb. 16, 2006

(65) Prior Publication Data

US 2007/0287025 A1 Dec. 13, 2007

(30) Foreign Application Priority Data

Aug. 13, 2004 (JP) .............................. 2004-236125
Feb. 21, 2005 (JP) .............................. 2005-044873

(51) Int. Cl.
*H01B 5/14* (2006.01)
*G02F 1/1343* (2006.01)
*H01M 14/00* (2006.01)
*H05B 33/28* (2006.01)
*H05B 33/14* (2006.01)
*G09F 9/30* (2006.01)

(52) U.S. Cl. ....................... 428/640; 428/701

(58) Field of Classification Search ........................ None
See application file for complete search history.

(56) References Cited

U.S. PATENT DOCUMENTS 6,297,442 B1 * 10/2001 Yagi et al. ................... 136/256

(Continued)

FOREIGN PATENT DOCUMENTS

JP 2000260355 A * 9/2000
JP 2004-095240 3/2004

OTHER PUBLICATIONS

C.Garzella et al. Sensors and Actuators B83, 2002, 230-237.*
Z. Bei et al. J. Mat. Res., vol. 19, 11, 2004, 3189-3195.*
D.Morris et.al. Physical Review B. vol. 61, 20, 2000, 445-457.*

*Primary Examiner*—Jennifer C McNeil
*Assistant Examiner*—Vera Katz
(74) *Attorney, Agent, or Firm*—Wood, Herron, & Evans, LLP

(57) ABSTRACT

With regard to a substrate for a transparent electrode and transparent conductive thin film each having transparency and conductivity, a transparent metal material and transparent electrode are provided which are capable of being stably supplied and are composed of raw materials with superior chemical resistance. When a metal oxide layer (12) composed of an anatase type crystal structure is provided on a substrate (11) to constitute the metal oxide layer (12) by $M:TiO_2$, low resistivity is achieved while internal transmittance is maintained. $M:TiO_2$ obtained by substituting other atoms (Nb, Ta, Mo, As, Sb, or W) for Ti of the anatase type $TiO_2$ enable maintenance of transparency and remarkably improvement of electric conductivity.

11 Claims, 14 Drawing Sheets

U.S. PATENT DOCUMENTS

| | | |
|---|---|---|
| 7,095,089 B2 * | 8/2006 | Yagi et al. .................. 257/433 |
| 2002/0107144 A1 * | 8/2002 | Fujishima et al. ........... 502/350 |
| 2003/0140963 A1 * | 7/2003 | Yamanaka et al. .......... 136/263 |
| 2003/0214695 A1 * | 11/2003 | Abramson et al. .......... 359/265 |
| 2004/0094801 A1 * | 5/2004 | Liang et al. ................. 257/347 |
| 2006/0137737 A1 * | 6/2006 | Nakayama et al. .......... 136/255 |

\* cited by examiner

TRANSPARENT CONDUCTOR, TRANSPARENT ELECTRODE, SOLAR CELL, LIGHT EMITTING DEVICE AND DISPLAY PANEL

TECHNICAL FIELD

The present invention relates to a transparent conductor to be applied for a liquid crystal panel, a solar cell, an organic electroluminescence (EL) electrode, and the like.

BACKGROUND ART

In recent years, needs for enlargement of liquid crystal display panels and needs for smaller-size and portability have risen. In order to achieve these, low power consumption of a display device is required and it is necessary to apply a transparent electrode having high visible light transmittance and low resistance value.

Particularly, an organic electroluminescence (EL) device developed recently is a self-luminous type device and can be effectively applied to a small portable device, however, there are problems in which the organic EL device is a current driven device and has a large power consumption Furthermore, a plasma display panel (PDP) which is spreading in the market recently and a field emission display (FED) currently developed as a next-generation display have a problem in that they have high power consumption structures. Therefore, a low resistance-transparent conductive thin film is greatly expected.

In order to decrease the resistance value of the transparent conductive thin film, the transparent conductive thin film in which an indium tin oxide film (hereinafter referred to as ITO film) consisting of indium oxide doped with tin within a certain percentage is provided on the surface of a transparent substrate such as a glass plate or the like is proposed (for example, patent document 1).

The ITO film has superior transparency and high conductivity, however, there are problems that the content of indium in the earth crust is very low 50 ppb and the cost of raw materials increases as resources are exhausted.

In recent years, a zinc oxide material has been proposed as a low-priced material having high plasma resistance.

However, since the zinc oxide material is weak to acid or alkali, and is gradually eroded in a carbon dioxide atmosphere, particularly, application to a solar cell becomes difficult as well as application to a liquid crystal panel. Even if it is considered that the surface of the zinc oxide is treated by a coating process in order to improve the chemical resistance, adding a process for coating causes an increase in production cost.

For enlarging applicability of the transparent conductor, it is required that the transparent conductor consists of raw materials which can be stably supplied and have chemical resistance and durability in combination.

Patent Document 1: Japanese Unexamined Patent Application, First Publication 2004-095240

DISCLOSURE OF INVENTION

Problems to be Solved by the Invention

The present invention was made in view of the above-described background technology. Its object is to provide a transparent conductor having transparency and conductivity which is capable of being stably supplied and is composed of raw materials with superior chemical resistance.

Means for Solving the Problem

The first aspect of the present invention is a transparent conductor including a metal oxide characterized in that the metal oxide is $M:TiO_2$ having an anatase type crystal structure.

The second aspect of the present invention is a transparent conductor including a metal oxide characterized in that the metal oxide is a $M:TiO_2$ having an anatase type crystal structure (M is one selected from the group consisting of Nb, Ta, Mo, As, Sb and W).

The third aspect of the present invention is a transparent conductor including a metal oxide characterized in that the metal oxide is a $M:TiO_2$ having an anatase type crystal structure (M is one selected from the group consisting of V, Mn, Tc, Re, P, and Bi).

The fourth aspect of the present invention is a transparent conductor including a metal oxide characterized in that the metal oxide is a $M:TiO_2$ having an anatase type crystal structure (M is one selected from the group consisting of Ta and Nb).

The fifth aspect of the present invention is a transparent conductor according to the first aspect characterized in that the metal oxide also has metallic electric conductivity.

The sixth aspect of the present invention is a transparent conductor according to the fourth aspect characterized in that the metal oxide is represented by the formula $Ti_{1-x}Nb_xO_2$ ($0.001 \leq x \leq 0.2$).

The seventh aspect of the present invention is a transparent conductor according to the fourth aspect characterized in that the metal oxide is represented by the formula $Ti_{1-x}Nb_xO_2$ ($0.01 \leq x \leq 0.2$).

The eighth aspect of the present invention is a transparent conductor according to the fourth aspect characterized in that the metal oxide is represented by the formula $Ti_{1-x}Nb_xO_2$ ($0.01 \leq x \leq 0.03$).

The ninth aspect of the present invention is a transparent conductor according to the fourth aspect characterized in that the metal oxide is represented by the formula $Ti_{1-x}Nb_xO_2$ ($0.01 \leq x \leq 0.6$).

The tenth aspect of the present invention is a transparent conductor according to the fourth aspect characterized in that the metal oxide is represented by the formula $Ti_{1-x}Nb_xO_2$ ($0.02 \leq x \leq 0.6$).

The eleventh aspect of the present invention is a transparent conductor according to the fourth aspect characterized in that the metal oxide is represented by the formula $Ti_{1-x}Ta_xO_2$ ($0.001 \leq x \leq 0.2$).

The twelfth aspect of the present invention is a transparent conductor according to the fourth aspect characterized in that the metal oxide is represented by the formula $Ti_{1-x}Ta_xO_2$ ($0.005 \leq x \leq 0.2$).

The thirteenth aspect of the present invention is a transparent conductor according to the fourth aspect characterized in that the metal oxide is represented by the formula $Ti_{1-x}Ta_xO_2$ ($0.01 \leq x \leq 0.1$).

The fourteenth aspect of the present invention is a transparent conductor according to the fourth aspect characterized in that the metal oxide is represented by the formula $Ti_{1-x}Ta_xO_2$ ($0.03 \leq x \leq 0.1$).

The fifteenth aspect of the present invention is a transparent conductor according to the fourth aspect characterized in that the metal oxide is represented by the formula $Ti_{1-x}Ta_xO_2$ ($0.05 \leq x \leq 0.1$).

The sixteenth aspect of the present invention is a transparent conductor according to the fourth aspect characterized in that the metal oxide is represented by the formula $Ti_{1-x-y}Nb_x Ta_yO_2$ ($0 \leq x+y \leq 0.4$).

The seventeenth aspect of the present invention is a transparent conductor according to the fourth aspect characterized in that the metal oxide is represented by the formula $Ti_{1-x-y} Nb_xTa_yO_2$ ($0 \leq x+y \leq 0.3$).

The eighteenth aspect of the present invention is the transparent conductor according to the first aspect characterized in that the metal oxide is provided on a perovskite type crystal substrate.

The nineteenth aspect of the present invention is the transparent conductor according to the fourth aspect characterized in that the metal oxide has resistivity of $2 \times 10^{-4}$ to $5 \times 10^{-4}$ $\Omega$ cm at room temperature or $8 \times 10^{-5}$ to $2 \times 10^{-4}$ $\Omega$cm at cryogenic temperature.

The twentieth aspect of the present invention is the transparent conductor according to the fourth aspect characterized in that the metal oxide has resistivity of $2 \times 10^{-4}$ to $1.8 \times 10^{-3}$ $\Omega$ cm at room temperature or $5 \times 10^{-5}$ to $7 \times 10^{-4}$ $\Omega$cm at cryogenic temperature.

The twenty-first aspect of the present invention is a transparent electrode comprising the transparent conductor according to the first aspect.

The twenty-second aspect of the present invention is the transparent conductor according to the first aspect characterized in that the metal oxide is provided to a GaN compound film.

The twenty-third aspect of the present invention is the transparent conductor according to the first aspect characterized in that the metal oxide is provided to an oriented film which is provided to a substrate.

The twenty-fourth aspect of the present invention is the transparent conductor according to the twenty-third aspect characterized in that the oriented film is at least one selected from the group consisting of ZnO, $ZrO_2$, $SrTiO_3$, MgO, $LaAlO_3$, $CeO_2$, $ZrO_2$, and $Al_2O_3$ films.

The twenty-fifth aspect of the present invention is the transparent conductor according to the twenty-third aspect characterized in that the oriented film is a ZnO film.

The twenty-sixth aspect of the present invention is the transparent conductor according to the first aspect characterized in that a d electron imparts electric conductivity.

The twenty-seventh aspect of the present invention is a solar cell comprising the transparent conductor according to the first aspect.

The twenty-eighth aspect of the present invention is a light emitting device comprising the transparent conductor according to the first aspect.

The twenty-ninth aspect of the present invention is a display panel comprising the transparent conductor according to the first aspect.

Effect of the Invention

The present invention enables a remarkable increase of the electric conductivity while maintaining the transparency by using $M:TiO_2$ obtained by replacing Ti site of an anatase type $TiO_2$ with another metal atom (Nb, Ta, Mo, As, Sb, W, or the like) or the like. The crystalline form of the $M:TiO_2$ may be a single crystal or a polycrystal.

Particularly, when the Nb substitution is 0.1 to 20% as the ratio of the number of Nb and Ti atoms (Nb/Ti) in the metal oxide, it becomes possible to suppress the resistivity to a level of $10^{-4}$ $\Omega$cm.

When the Nb substitution is 1 to 20% as the ratio of the number of Nb and Ti atoms (Nb/Ti) in the metal oxide, it becomes possible to suppress the resistivity to a level of $10^{-4}$ $\Omega$cm while the internal transmittance is maintained at a high level.

When the Nb substitution is 1 to 6% as the ratio of the number of Nb and Ti atoms (Nb/Ti) in the metal oxide, it becomes possible to improve the internal transmittance to 95 to 98% (when the metal oxide is formed to a thin film as a sample and the thickness of the film is approximately 50 nm).

When the Nb substitution is 2 to 6% as the ratio of the number of Nb and Ti atoms (Nb/Ti) in the metal oxide, it becomes possible to suppress the resistivity to approximately $5 \times 10^{-4}$ $\Omega$cm at room temperature and $1 \times 10^{-4}$ $\Omega$cm at cryogenic temperature (approximately 5K) while the internal transmittance is further improved.

Furthermore, when the Ta substitution is 0.1 to 20% as the ratio of the number of Ta and Ti atoms (Ta/Ti) in the metal oxide, it becomes possible to suppress the resistivity to a level between $10^{-4}$ $\Omega$cm and $10^{-3}$ $\Omega$cm.

When the Ta substitution is 0.5 to 20% as the ratio of the number of Ta and Ti atoms (Ta/Ti) in the metal oxide, it becomes possible to suppress the resistivity to a level between $10^{-4}$ $\Omega$cm and $10^{-3}$ $\Omega$cm while the internal transmittance is maintained at a high level.

When the Ta substitution is 1 to 5% as the ratio of the number of Ta and Ti atoms (Ta/Li) in the metal oxide, it becomes possible to stably obtain high internal transmittance even if red light is used.

When the Ta substitution is 1 to 3% as the ratio of the number of Ta and Ti atoms (Ta/Ti) in the metal oxide, it becomes possible to suppress the resistivity to approximately $5 \times 10^{-4}$ $\Omega$cm at room temperature and $1 \times 10^{-4}$ to $2 \times 10^{-4}$ $\Omega$cm at cryogenic temperature while high internal transmittance is stably obtained even if red light is used.

By providing (forming) the metal oxide to the perovskite type crystal substrate, it becomes possible to generate the anatase type crystal structure further selectively.

By setting the resistivity of the metal oxide to $2 \times 10^{-4}$ to $5 \times 10^{-4}$ $\Omega$cm at room temperature or $8 \times 10^{-5}$ to $2 \times 10^{-4}$ $\Omega$cm at cryogenic temperature, or to $3 \times 10^{-4}$ to $1.8 \times 10^{-3}$ $\Omega$cm at room temperature or $5 \times 10^{-5}$ to $7 \times 10^{-4}$ $\Omega$cm at cryogenic temperature, it becomes possible to remarkably extend applicability for various devices such as a display panel. According to the present invention, particularly, enlargement of area and mass production of the transparent conductor are carried out using the $TiO_2$ film deposition technique. Therefore, a substrate for transparent electrodes is able to be applied to an electrode for a solar cell which uses $TiO_2$ as a photocatalyst in addition to application for an electrode of a conventional solar cell. Applying the substrate for transparent electrodes to a liquid crystal display panel causes a reduction of the power consumption of a display device of the liquid crystal display panel, and therefore, enlargement and miniaturization for portability of the liquid crystal display panel are accelerated.

According to the above-described constitution in the present invention, the labor accompanying production is remarkably reduced in addition to cost reduction with facilitation of raw material acquisition and simplification of production processes.

Since $TiO_2$ having high durability to chemicals and outside air is used as a parent material in the present invention, it becomes possible to extend applicability to solar cells to be expected with the usage in field. Furthermore, since a coating process is not required, cost reduction with a decrease of the number of processes is achieved.

Other objects, characteristics, and advantages of the present invention will be described by the detailed description with reference to the following best mode for carrying out the invention and attached drawings.

BRIEF DESCRIPTION OF THE REFERENCE SYMBOLS

Figure 1:
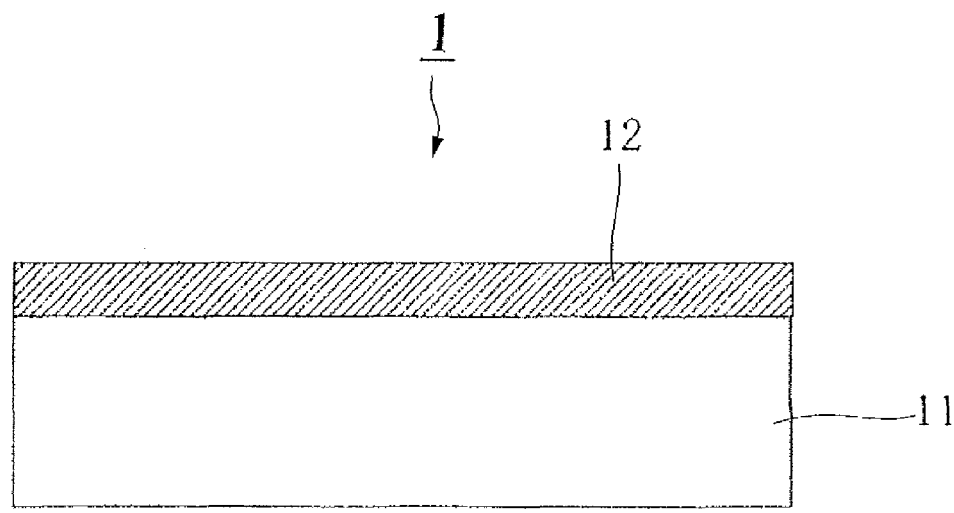
FIG. 1 is a diagram showing a substrate for a transparent electrode formed by laminating metal oxide layers on the substrate.

1 Transparent metal
11 Substrate
12 Metal oxide layer
30 PLD device
31 Chamber
32 Light emitter
33 Reflecting mirror
34 Lens
36 Infrared lump
39 Target
40 Oil-sealed rotary pump
41 Back-flow preventing valve
42 Turbo molecular pump
43 Pressure valve
45 Oxygen gas flow rate regulating valve

BEST MODE FOR CARRYING OUT THE INVENTION

Embodiments of the present invention are explained in detail with reference to drawings.

The present invention is applied for use as a transparent metal (transparent conductor) 1 to be applied to electrodes of display panels, organic ELs, solar cells, or the like. The present invention comprises a metal oxide layer 12 formed on a substrate 11 as a polycrystal or single crystal as shown in FIG. 1.

The transparent metal 1 shows metallic electric conductivity in the transparent conductor until the cryogenic temperature (5K) in which the metallic electric conductivity is defined to have $10^{-2}$ Ωcm or less of resistivity at room temperature and dR/dT>0 (R: resistivity, T: temperature) of temperature dependency of resistivity. The metallic electric conductivity preferably has $10^{-3}$ Ωcm or less of resistivity at room temperature in view of increasing general use.

The substrate 11 is composed of strontium titanate (SrTiO₃) formed so that a substrate surface 11a is a (100) plane.

The substrate 11 may be composed of a $SrTiO_3$ single crystal substrate, or may be composed of any material as long as the material is another perovskite type crystal or a rock type crystal containing similar structure thereto. That is, when the substrate 11 is composed of perovskite type or rock type crystal, an anatase single crystal thin layer can be formed.

The substrate 11 may be composed of an amorphous material such as glass, quartz, or plastic. In this case, an anatase polycrystal thin layer is formed, however, it hardly affects fundamental physical properties such as resistivity.

Although the thickness of the substrate 11 is not limited to 50 nm, as described in the following embodiment, the thickness is, for example, preferably 1000 nm or less. The thickness may be greater than 1000 nm if substrate 11 is required to have lower resistance and is allowed to have slightly lower transmittance.

The metal oxide layer 12 formed by laminating on the substrate 11 is composed of $Nb:TiO_2$. $Nb:TiO_2$ is formed by substituting Nb for Ti of the anatase $TiO_2$. Nb may be replaced with, for example, Ta, Mo, As, Sb, or W. Another element may also be used. The metal oxide layer 12 is formed on a substrate surface 12a with epitaxial growth. The thickness of the metal oxide layer 12 is preferably 40 to 50 nm, however, the thickness is not limited to this range.

Next, a method for preparing transparent metal 1 is explained.

First, a SrTiO$_3$ substrate which is cut so that the substrate surface becomes a (100) plane is mechanically polished using, for example, a diamond slurry. In the mechanical polishing, the particle size of the diamond slurry used is gradually made finer and lastly, mirror polishing is carried out with approximately 0.5 µm of the particle size of the diamond slurry. After the mirror polishing, the surface of SrTiO$_3$ substrate may be flattened by further polishing with colloidal silica until the RMS of the surface roughness becomes 10 Å or less.

Next, Nb:TiO$_2$ is deposited on the SrTiO$_3$ (100) plane of the substrate 11 by a physical vapor deposition (PVD) process. Hereinafter, the case that the deposition is performed by a pulsed laser deposition (PLD) process is explained.

Figure 2:
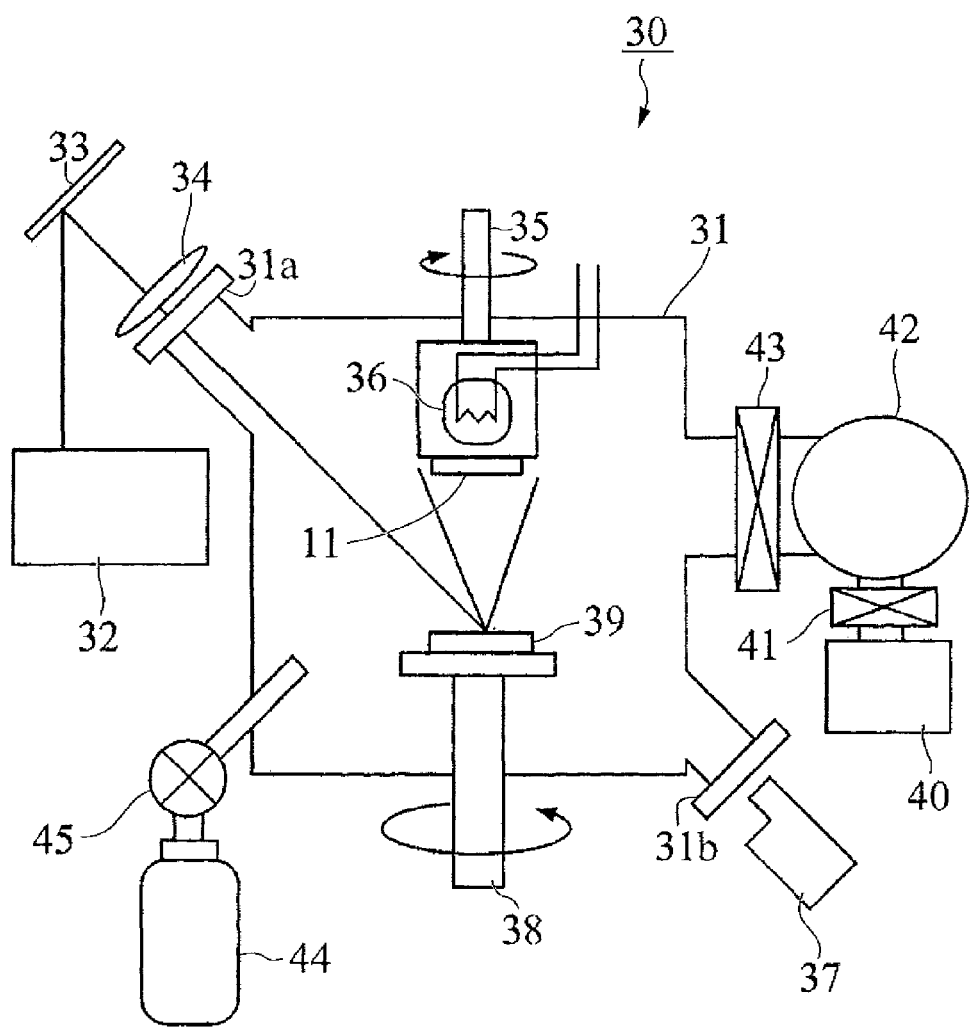
FIG. 2 is a diagram for explaining the structure of a PLD device.
Figure 3A:
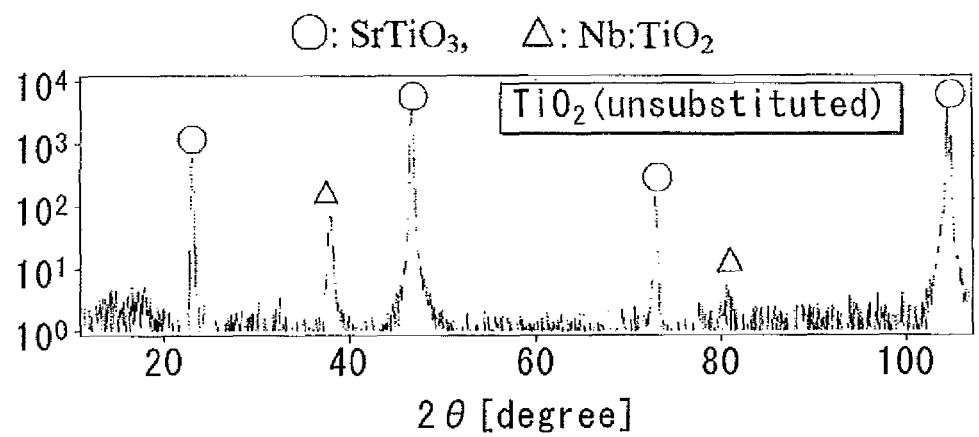
FIG. 3A is a diagram showing the result of an X-ray diffraction measurement of metal oxide layers.
Figure 3B:
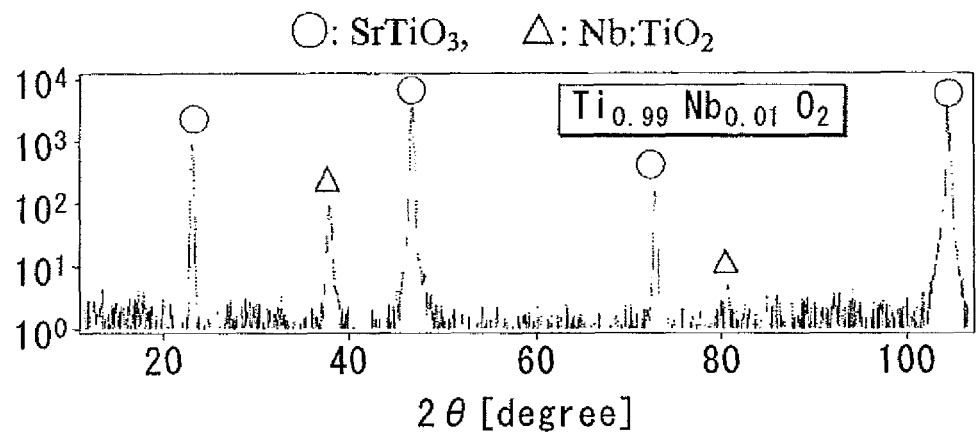
FIG. 3B is a diagram showing the result of an X-ray diffraction measurement of a metal oxide layer.
Figure 4A:
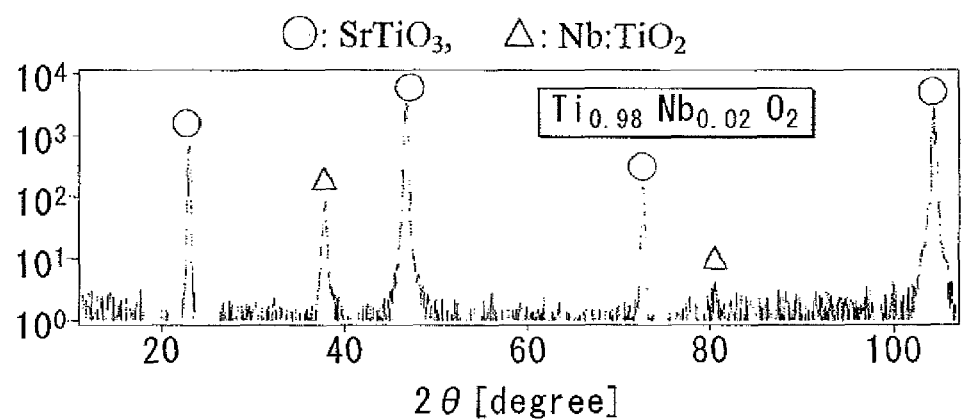
FIG. 4A is a diagram showing the result of an X-ray diffraction measurement of a metal oxide layer.
Figure 4B:
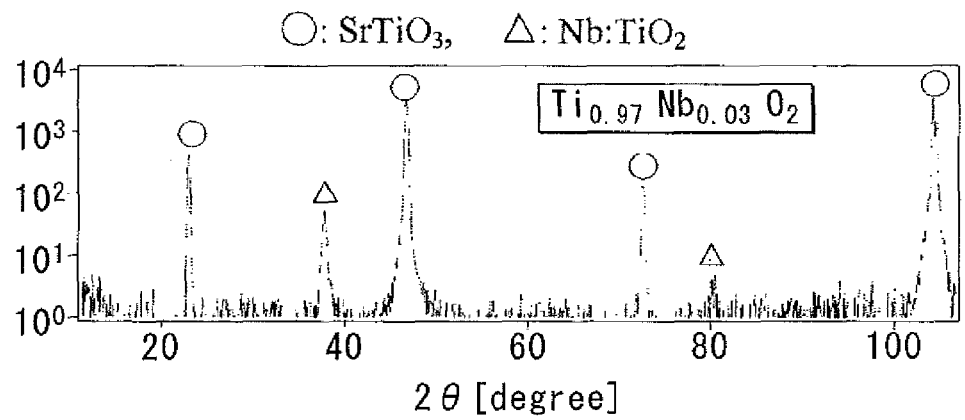
FIG. 4B is a diagram showing the result of an X-ray diffraction measurement of a metal oxide layer.
Figure 5A:
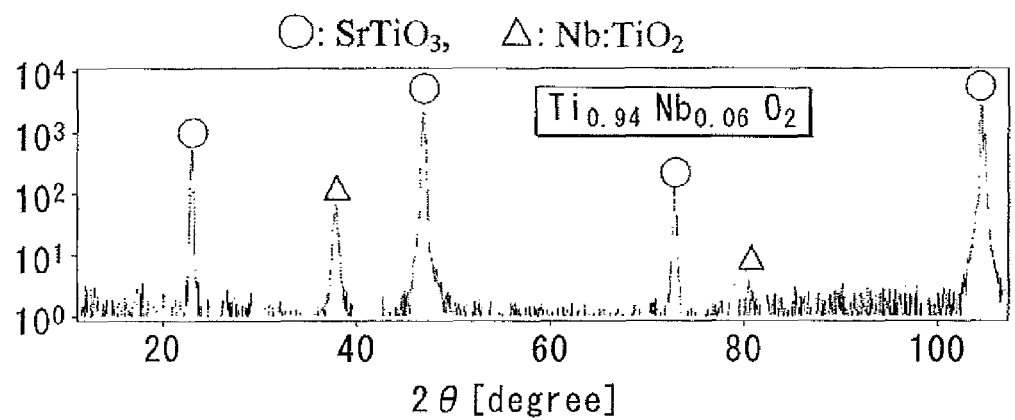
FIG. 5A is a diagram showing the result of an X-ray diffraction measurement of a metal oxide layer.
Figure 5B:
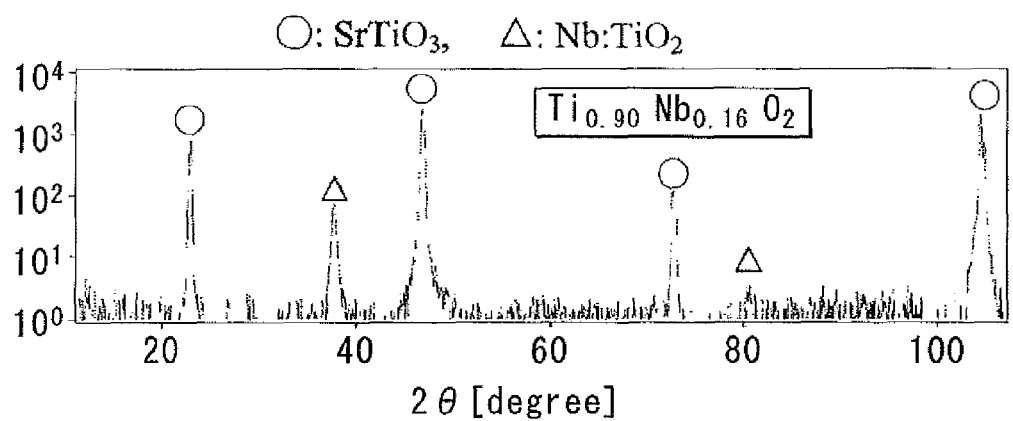
FIG. 5B is a diagram showing the result of an X-ray diffraction measurement of a metal oxide layer.
Figure 6A:
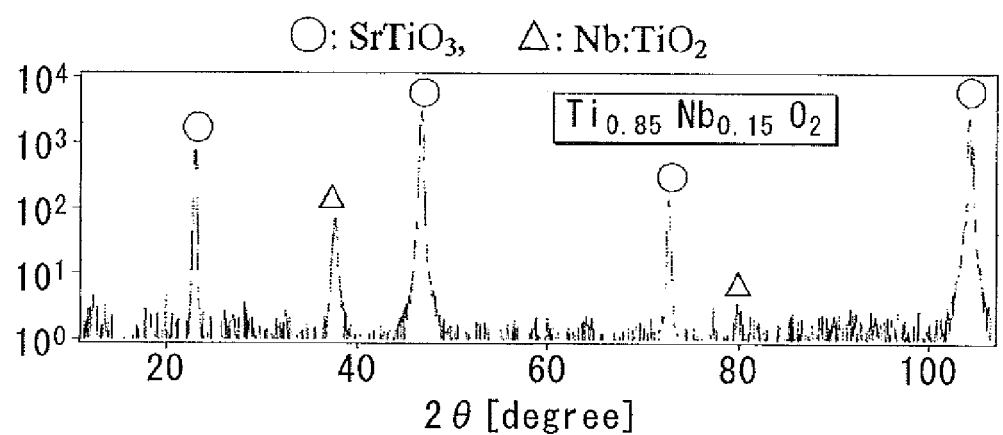
FIG. 6A is a diagram showing the result of an X-ray diffraction measurement of a metal oxide layer.
Figure 6B:
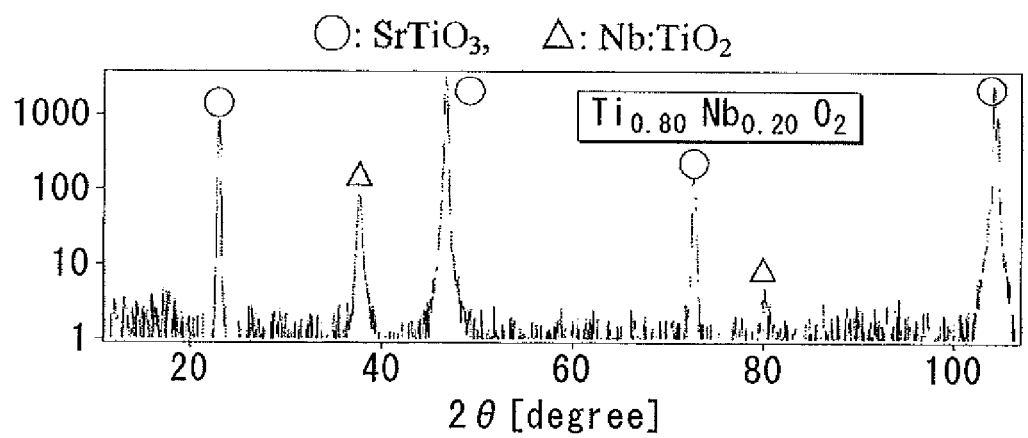
FIG. 6B is a diagram showing the result of an X-ray diffraction measurement of a metal oxide layer.
Figure 7:
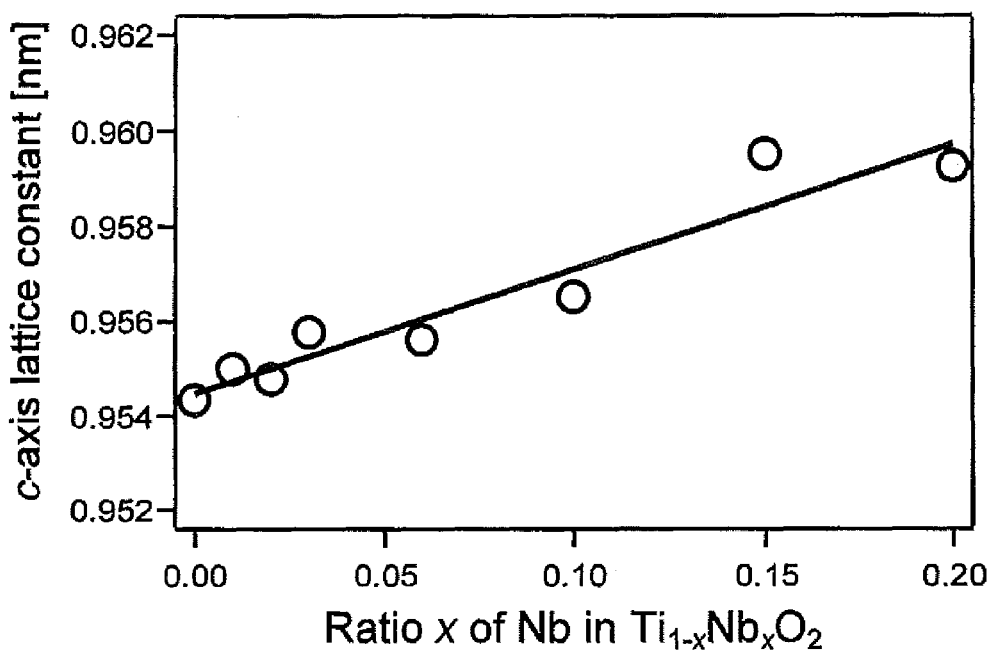
FIG. 7 is a diagram showing the result of a lattice constant measurement of metal oxide layers.

In the PLD process, the metal oxide layer 12 is deposited on the substrate 11 using a PLD device 30 as shown in FIG. 2. The PLD device 30 comprises a chamber 31, the substrate 11 and a target 39 provided in the chamber 31, a light emitter 32 which is provided opposite to the surface of the target 39 outside the chamber 31, a reflecting mirror 33 for adjusting the position of a pulsed laser light emitted from the light emitter 32 provided outside the chamber 31, a lens 34 for controlling a spot diameter of a laser beam provided outside the chamber 31, and a gas supply device 44 for injecting oxygen gas into the chamber 31 provided outside the chamber 31.

The chamber 31 is provided for preparing a high quality thin film by maintaining an appropriate degree of vacuum and, concurrently, by preventing contamination from the outside. In the chamber 31, an infrared lump 36 is provided for heating a substrate. The temperature of substrate is monitored by a radiation thermometer 37 provided outside the chamber 31 via a window 31b and is controlled so as to always be a constant temperature. Furthermore, a valve 45 for regulating the flow rate of oxygen gas is provided in the chamber 31. In order to achieve film deposition under reduced pressure, the chamber 31 is connected with a turbo molecular pump 42 and a pressure valve 43. The pressure of the chamber 31 is controlled by the oxygen gas flow rate regulating valve 45 and the pressure valve 43 so as to be $10^{-5}$ to $1 \times 10^{-4}$ torr in, for example, an oxygen atmosphere. The turbo molecular pump 42 is connected with an oil-sealed rotary pump 40 and a back-flow preventing valve 41 and the pressure at the exhaust side of the turbo molecular pump 42 is always maintained so as to be $10^{-4}$ torr or less.

A window 31a is further provided at the surface of the chamber 31 which is opposite to the target 39. The light emitter 32 emits the pulsed laser light incident on the chamber 31 via the window 31a. The light emitter 32 emits a KrF excimer laser having, for example, 1 to 10 Hz of pulse frequency, 50 mJ/pulse of laser power, and 248 nm of wavelength as the above-described pulsed laser light. The emitted pulsed laser light is spot-adjusted so that the focal position is near the target 39 by the reflecting mirror 33 and the lens 34, and incidence is carried out at an angle of approximately 45° to the surface of the target 39 provided in the chamber 31 via the window 31a.

The target 39 is composed of, for example, a Nb:TiO$_2$ sintered body. The metal to be substituted is Nb as an example in this embodiment, however, any one of Ta, Mo, As, Sb, and W may be used or plural kinds of metals may be combined. The Nb:TiO$_2$ sintered body is prepared by mixing TiO$_2$ powder and Nb$_2$O$_5$ powder which are weighed so as to be a desired atomic ratio and further heat-molding the mixed powder. The target 39 is provided to be parallel to the (100) plane of the substrate 11.

The film deposition process based on the PLD method is explained below.

The substrate 11 which is polished is provided in the chamber 31. Next, the substrate 11 is annealed under an oxygen atmosphere of $10^{-5}$ Torr at 650° C. substrate temperature in order to remove impurities on the surface of the substrate 11 and flatten the surface at an atomic level. At least one hour is required as the annealing time.

The substrate 11 is driven with rotation by motor 35 under an oxygen atmosphere $10^{-5}$ Torr at 550° C. of substrate temperature to deposit a film. The above-described pulsed laser light is intermittently irradiated to the target 39 while the target 39 is driven with rotation via a rotation axis 38, and thereby the surface temperature of the target 39 is rapidly increased and ablation plasma is generated. Each atom of Ti, Nb, and O included in the ablation plasma migrates to the substrate 11 while gradually changing conditions by repeating the collisional reaction or the like with oxygen gas in the chamber 31. Particles including Ti, Nb, or O atoms arrived at the substrate 11 diffuse the (100) plane on the substrate 11 as it is, and a thin film is formed in the stablest condition in lattice matching. As a result, the transparent metal 1 composed of the above-described constitution is prepared.

The transparent metal 1 may be prepared by not only the PLD method described above but also, for example, other physical vapor deposition (PVD) methods such as a molecular beam epitaxy method (MBE), a sputtering method, and the like, or a method other than PLD methods such as chemical vapor deposition (CVD) methods using, for example, an MOCVD method. The transparent metal 1 may also be prepared by a synthetic process from a solution such as a sol-gel method, a chemical solution method, and the like.

An X-ray diffraction (XRD) measurement of the metal oxide layer 12 was carried out when the Nb substitutional rate x was 0, 0.01, 0.02, and 0.03 in the transparent metal Nb:TiO$_2$ (chemical formula Ti$_{1-x}$Nb$_x$O$_2$) prepared based on the above-described methods. The results are shown in FIGS. 3A, 3B, 4A, and 4B. Similarly, an X-ray diffraction (XRD) measurement of the metal oxide layer 12 was carried out when the Nb substitutional rate x was changed with 0.06, 0.1, 0.15, and 0.2 in the transparent metal Nb:TiO$_2$ (chemical formula Ti$_{1-x}$Nb$_x$O$_2$) prepared based on the above-described methods. The results are shown in FIGS. 5A, 5B, 6A, and 6B. According to the XRD spectrums shown in FIGS. 3A to 6B, SrTiO$_3$ peaks represented by circles in the figures appear at 2θ=23.1°, 46.8°, 72.6°, 104.2°. The Nb:TiO$_2$ peaks represented by triangles in the figures appear at 2θ=37.8° and 80.4°. Therefore, these results confirmed that Nb:TiO$_2$ is stably generated without depending on the Nb substitutional rate.

The relationship of lattice constant and the Nb substitutional rate x in the prepared metal oxide layer 12 was determined based on XRD spectrums when the Nb substitutional rate x was 0, 0.01, 0.02, 0.03, 0.06, 0.1, 0.15, and 0.20. It is found that the lattice constant increases as the rate of addition of Nb increases. This result suggests that the prepared metal oxide layer 12 exists as what is known as a solid solution.

Figure 8:
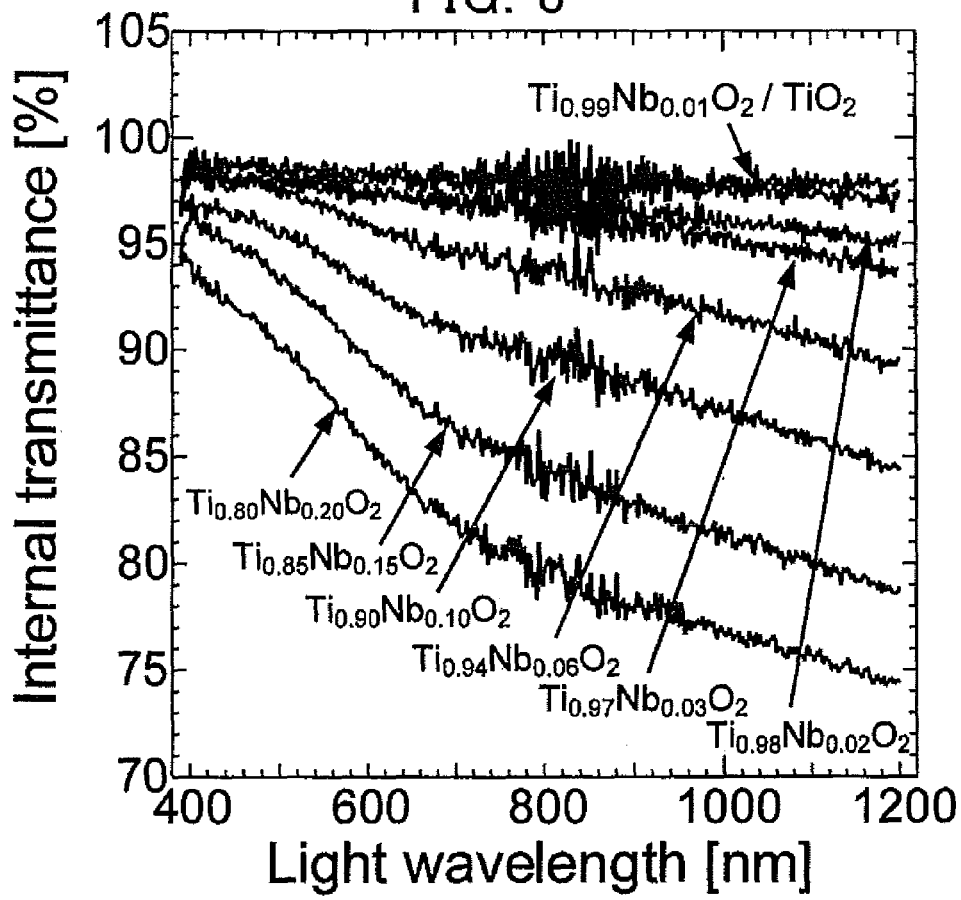
FIG. 8 is a diagram showing the result of the internal transmittance measurement of prepared metal oxide layers.

The internal transmittance of the prepared metal oxide layer 12 when the Nb substitutional rate x was 0, 0.01, 0.02, 0.03, 0.06, 0.1, 0.15, and 0.2 was determined. The "transmittance" in an original meaning must consider that the amount of reflection is a deficiency, and then, when the amount of reflection in the metal oxide layer 12 is deducted, the transmittance used as 100% is hereinafter referred to "internal transmittance". The result is shown in FIG. 8. As shown in FIG. 8, the internal transmittance is 80% or greater in the visible light region (400 to 800 nm of wavelength) which is a satisfactory result. In particular, a sample having the Nb substitutional rate x being 0.06 or less made it possible to achieve internal transmittance being 95% or greater in the visible light region. On the other hand, as the cause by which internal transmittance decreases as the Nb substitutional rate increases, it is considered that the amount of $Ti^{3+}$ as well as Nb substitutional rate increase and transition probability between $t_{2g}$-$e_g$ bands each having an absorption edge in the visible light region increases.

When the metal oxide layer 12 is actually applied to a device, the thickness of the metal oxide layer 12 is 100 nm or greater in many cases, and especially the specifications required in ITO now is 80% or greater internal transmittance to the film thickness 100 nm or greater. 95% or greater internal transmittance to the film thickness 50 nm is required for satisfying the specifications. As shown in FIG. 8, since suppressing the Nb substitutional rate to x being 0.06 or less satisfies the above-described specifications, a transparent conductor thin film which has higher internal transmittance than that of the conventional ITO thin film can be prepared.

Figure 9:
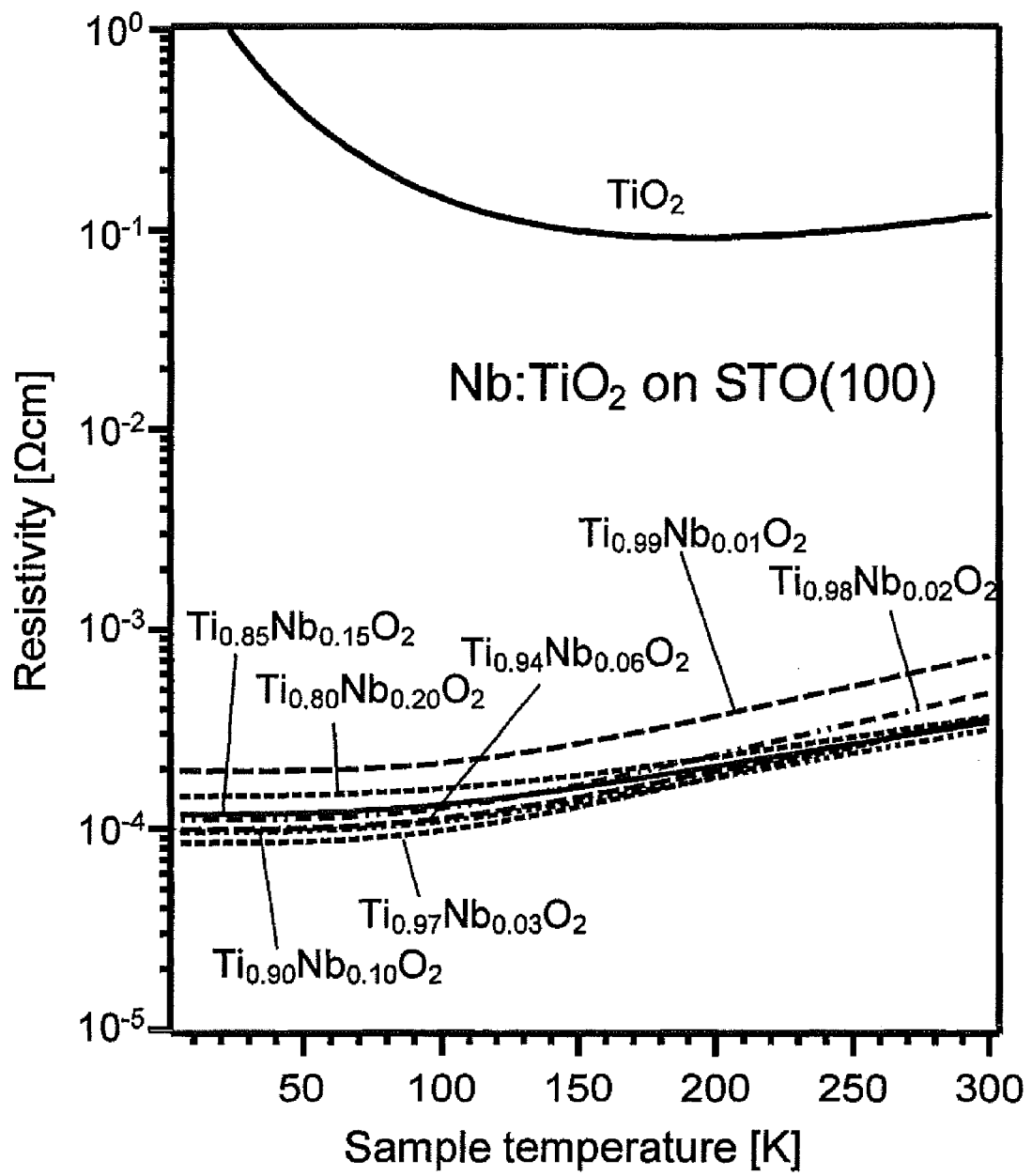
FIG. 9 is a diagram showing a temperature dependency to resistivity of prepared metal oxide layers.
Figure 10A:
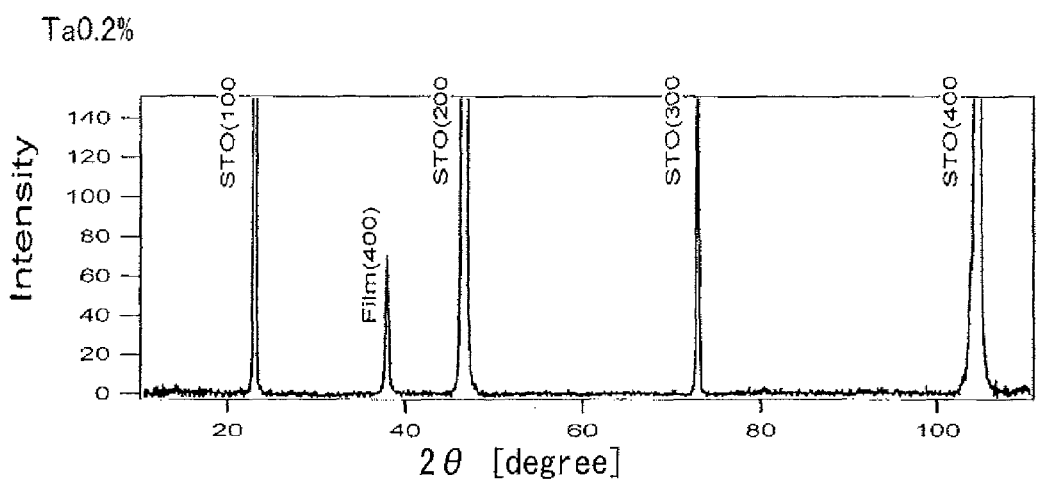
FIG. 10A is a diagram showing the result of an X-ray diffraction measurement of a metal oxide layer.
Figure 10B:
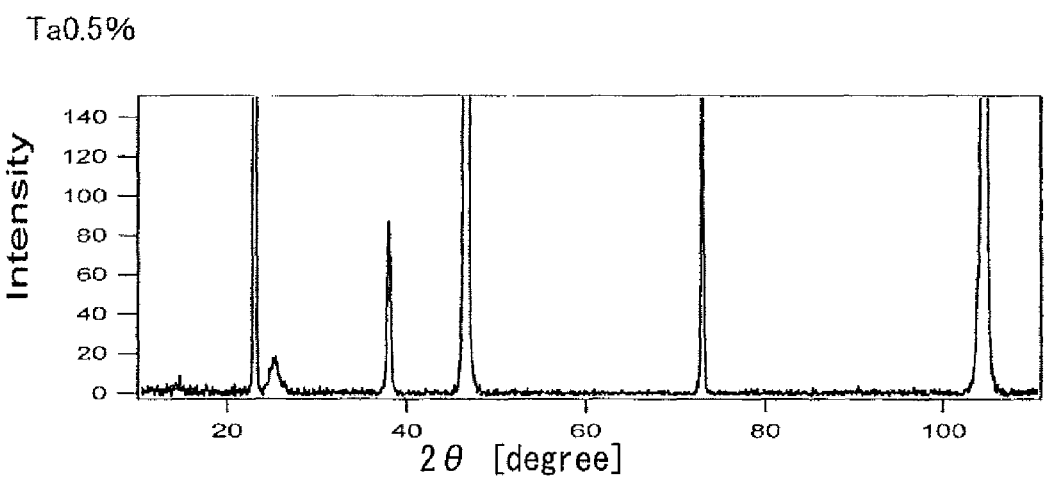
FIG. 10B is a diagram showing the result of an X-ray diffraction measurement of a metal oxide layer.
Figure 11A:
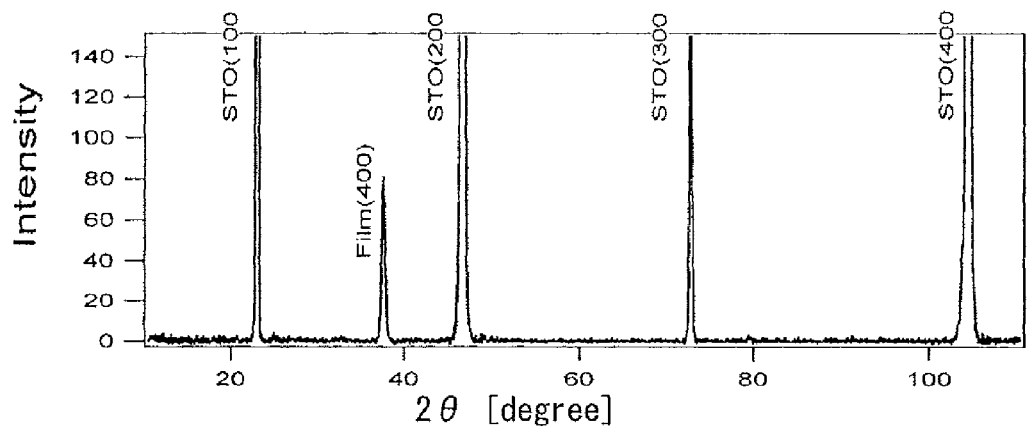
FIG. 11A is a diagram showing the result of an X-ray diffraction measurement of a metal oxide layer.
Figure 11B:
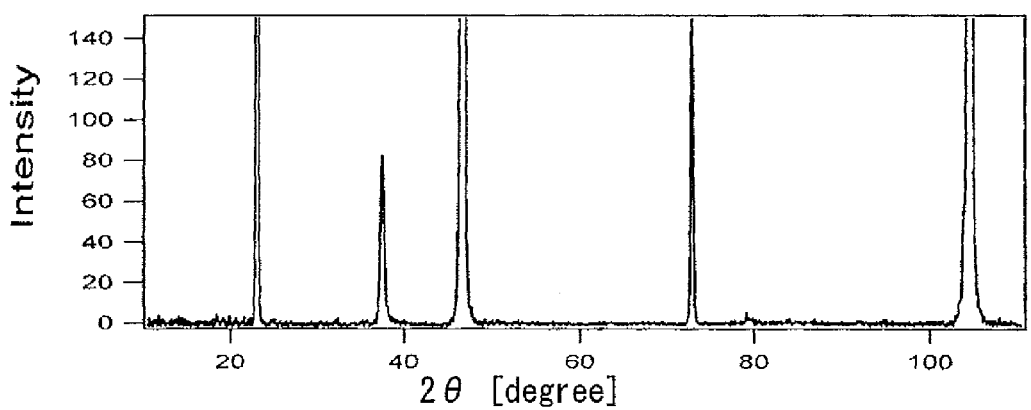
FIG. 11B is a diagram showing the result of an X-ray diffraction measurement of a metal oxide layer.

FIG. 9 shows the temperature dependency of the resistivity of the metal oxide layer 12 prepared with the above-described Nb substitutional rate. As shown in FIG. 9, the metal oxide layer 12 in which the Nb substitutional rate x is 0.01 or greater and 0.2 or less has satisfactory resistivity at a level of $10^{-4}$ $\Omega$ cm at room temperature in comparison with a metal oxide layer having no Nb.

The present invention makes it possible that the transparent metal 1 according to the present invention has resistivity at a level of $10^{-4}$ $\Omega$cm when the Nb substitutional rate x is not only 0.01 or greater and 0.2 or less but is also 0.001 or greater and 0.2 or less.

When the Nb substitutional ratio x is 0.01 or greater and 0.06 or less in the metal oxide layer 12, internal transmittance is improved to 95 to 98% with a film thickness of 50 nm and 80% or greater with a film thickness of 100 nm.

When the Nb substitutional ratio x is 0.02 or greater and 0.06 or less in the metal oxide layer 12, resistivity is decreased to $5 \times 10^{-4}$ $\Omega$cm at room temperature (280 to 300K) and $1 \times 10^{-4}$ $\Omega$cm at cryogenic temperature (5 to 20K) while internal transmittance is further improved.

The present invention makes it possible that the transparent metal 1 according to the present invention has high transparency and low resistivity at a level of $10^{-4}$$\Omega$cm almost equal to that of the ITO film in which Nb:TiO2 obtained by substituting Nb for Ti of the anatase TiO2 is used as the metal oxide layer 12.

If the Nb substitutional ratio of the metal oxide layer 12 is controlled so that the resistivity of the metal oxide layer 12 becomes $2 \times 10^{-4}$ to $5 \times 10^{-4}$ $\Omega$cm at room temperature or $8 \times 10^{-5}$ to $2 \times 10^{-4}$ $\Omega$cm at cryogenic temperature, it becomes possible to remarkably extend applicability to various devices such as a liquid crystal panel.

The X-ray diffraction (XRD) measurement of the metal oxide layer 12 was carried out when the Ta substitutional rate x was 0.002, 0.005, 0.15, and 0.20 in the transparent metal Ta:$TiO_2$ (chemical formula $Ti_{1-x}Ta_xO_2$) prepared based on the above-described methods. The results are shown in FIGS. 10A, 10B, 11A, and 11B. According to the XRD spectrums shown in FIGS. 10A to 11B, these results confirmed that Ta:$TiO_2$ is stably generated without depending on the Ta substitutional rate like Nb:$TiO_2$.

Figure 12:
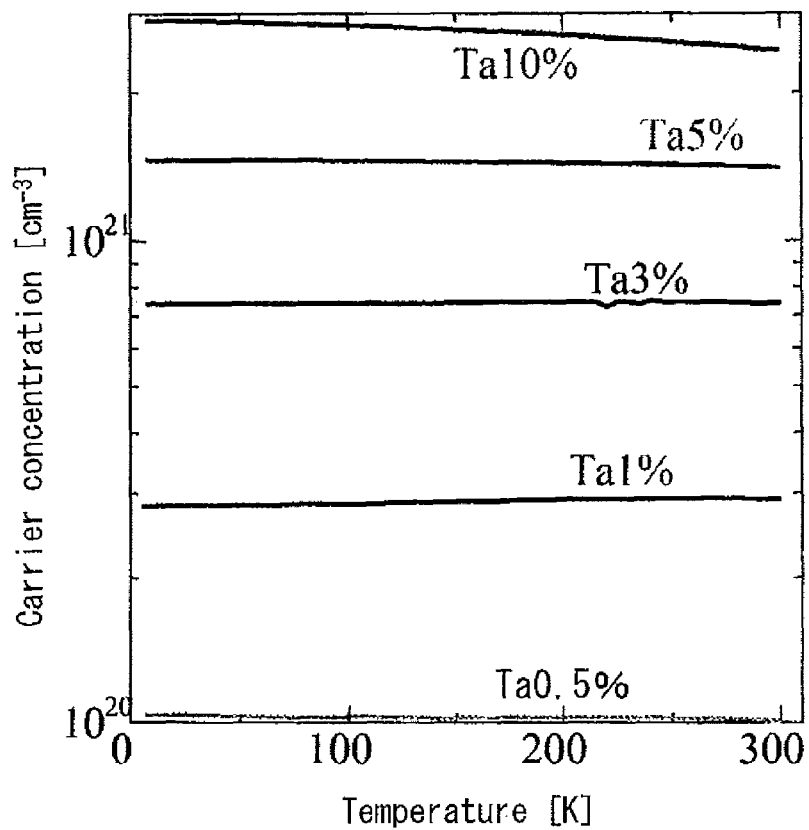
FIG. 12 is a diagram showing a measurement result of temperature variations of carrier concentrations of metal oxide layers.

FIG. 12 is a diagram showing a measurement result of temperature variations of carrier concentrations. Carrier concentrations were determined when the Ta substitutional rate was 0.005, 0.1, 0.03, 0.05, and 0.10. As shown in FIG. 12, the temperature dependency of the carrier concentration in any Ta substitutional rate did not appear. This means that Ta:$TiO_2$ is a degenerated semiconductor which is a property appearing in a transparent conductive film such as an ITO film.

Figure 13:
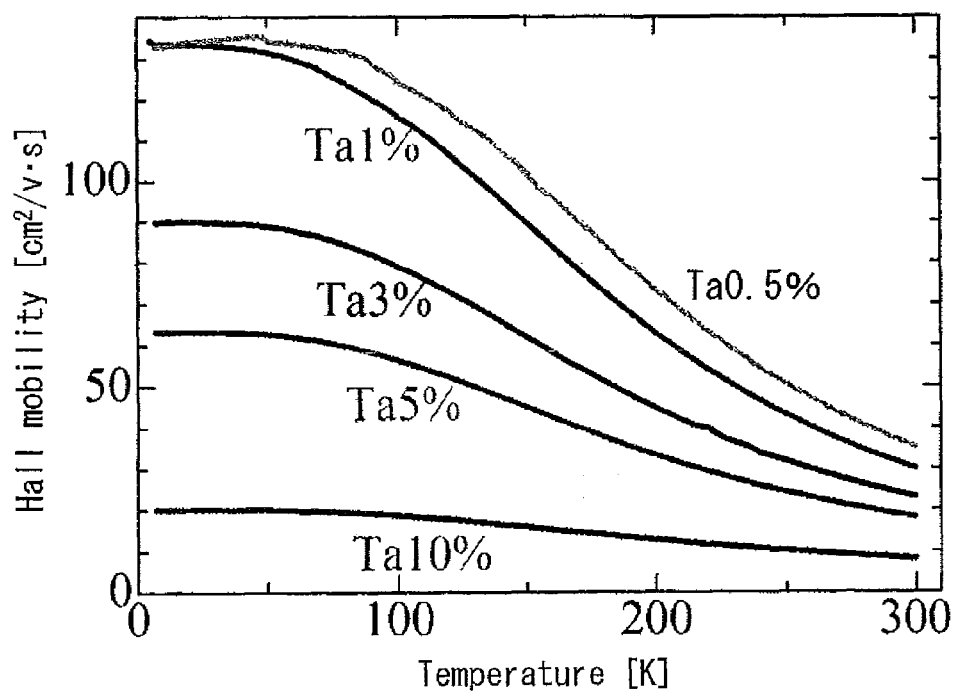
FIG. 13 is a diagram showing a measurement result of temperature variations of Hall mobilities of metal oxide layers.

FIG. 13 is a diagram showing a measurement result of temperature variations of Hall mobilities. Hall mobilities were determined when the Ta substitutional rate was 0.005, 0.1, 0.03, 0.05, and 0.10. As shown in FIG. 13, Hall mobilities decreased with a temperature rise in any Ta substitutional rate, and reduction of Hall mobility became large as the Ta substitutional rate became small. The temperature dependency of Hall mobility is a property which is not observed in ITO, and that causes an increase of resistivity with a temperature rise. The derivation of temperature dependency is not clear now, however, an increase of resistivity with the temperature rise is a property which is observed in ordinary metals and thereby Ta:$TiO_2$ is called a transparent metal.

Figure 14:
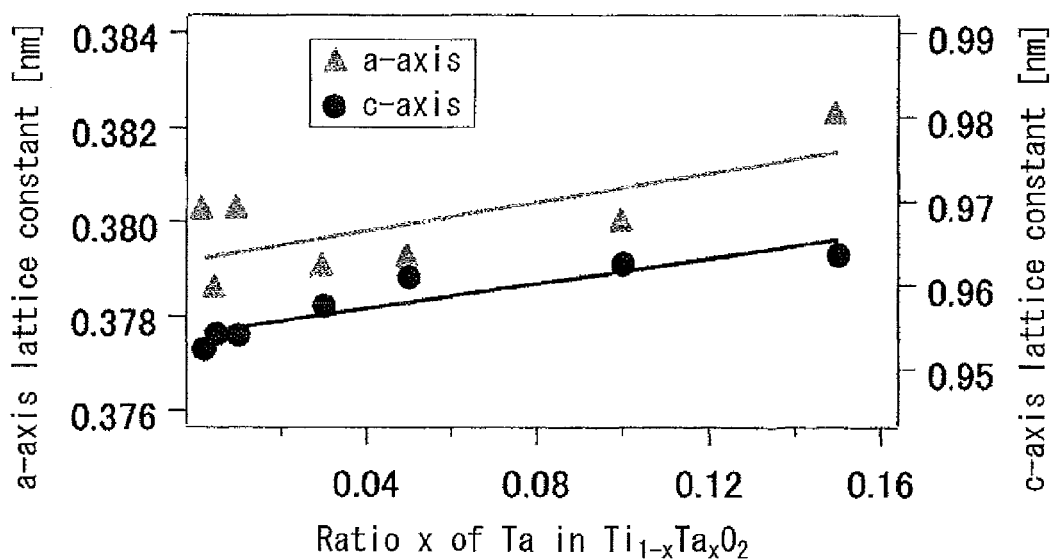
FIG. 14 is a diagram showing a measurement result of lattice constant of metal oxide layers.

The relationship of the lattice constant and the Ta substitutional rate x in the prepared metal oxide layer 12 was determined based on the XRD spectrum when the Nb substitutional rate x was 0.005, 0.1, 0.05, 0.10, 0.15, and 0.20. As shown in FIG. 14, it is found that lattice constant increases as the rate of addition of Nb increases, that is, it is found that lattice expands in accordance with Vegard's law (the linear relationship between the lattice constant and the composition of a solid solution alloy expressed with weight percentage). This result suggests that the prepared metal oxide layer 12 exists as what is known as a solid solution. In FIG. 14, triangles represent a-axis lattice constants and circles represent c-axis lattice constants.

Figure 15:
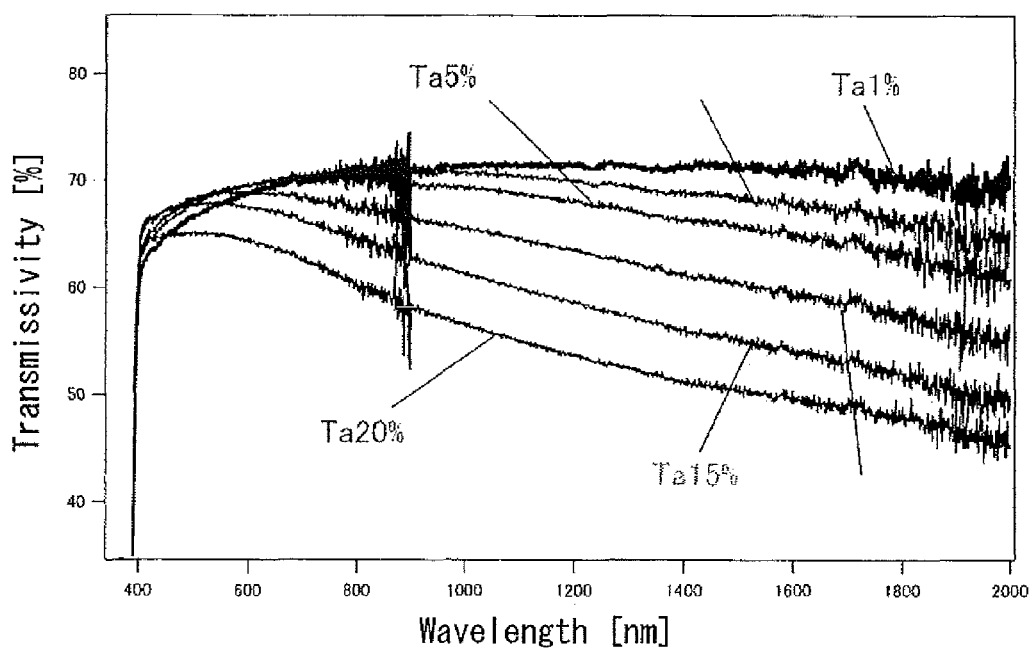
FIG. 15 is a diagram showing a measurement result of transmittance of metal oxide layers.

The transmittance of the metal oxide layer 12 prepared when the Ta substitutional rate x was 0.01, 0.03, 0.05, 0.10, 0.15, and 0.20 was determined. The result is shown in FIG. 15. As shown in FIG. 15, the transmittance is 60% or greater in the visible light region (400 to 800 nm of wavelength) which is a satisfactory result In particular, a sample having the Ta substitutional rate x being 0.05 or less made it possible to achieve stable and high transmittance even if in the visible light long-wavelength region (red region). On the other hand, as the cause by which transmittance decreases as the Ta substitutional rate increases, it is considered that the amount of $Ti^{3+}$ as well as the Ta substitutional rate increase and the transition probability between $t_{2g}$-$e_g$ bands each having an absorption edge in the visible light region increases.

Figure 16:
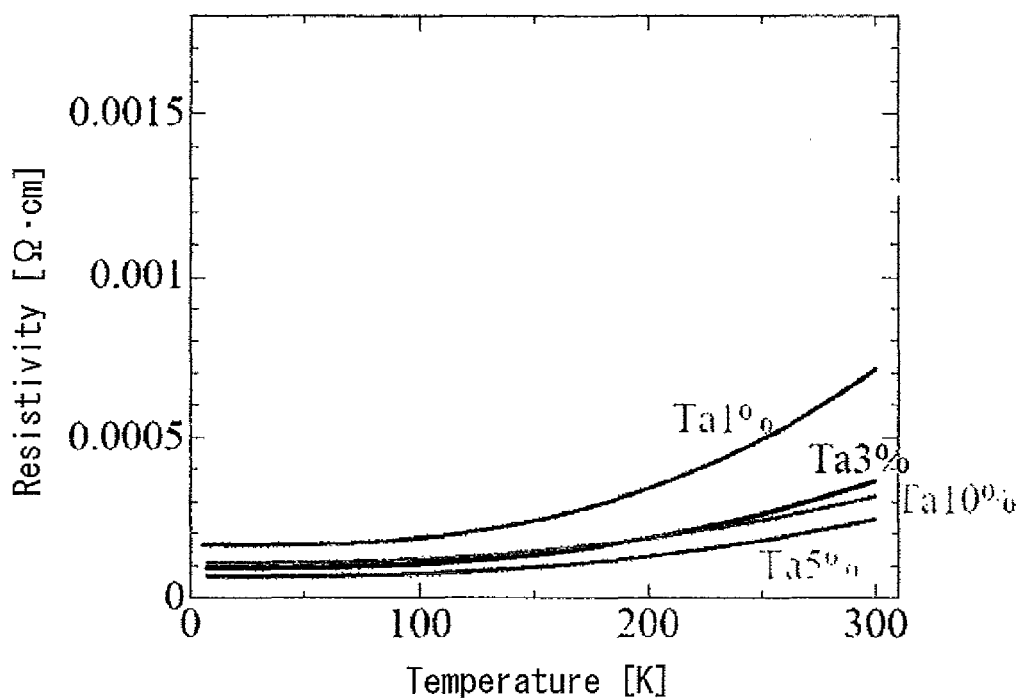
FIG. 16 is a diagram showing temperature dependencies of resistivities of prepared metal oxide layers.

FIG. 16 shows the temperature dependency of the resistivity of the metal oxide layer 12 prepared with the above-described Ta substitutional rate. As shown in FIG. 16, the metal oxide layer 12 in which the Ta substitutional rate x is 0.005 or greater and 0.2 or less has satisfactory resistivity at a level between $10^{-4}$ $\Omega$cm and $10^{-3}$ $\Omega$cm at room temperature. In view of further satisfactory conductivity, the Ta substitutional rate x is preferably 0.01 or greater and 0.1 or less. In view of satisfactory conductivity in a wide range from cryogenic temperature to room temperature, the Ta substitutional rate x is more preferably 0.03 or greater and 0.1 or less.

Figure 17:
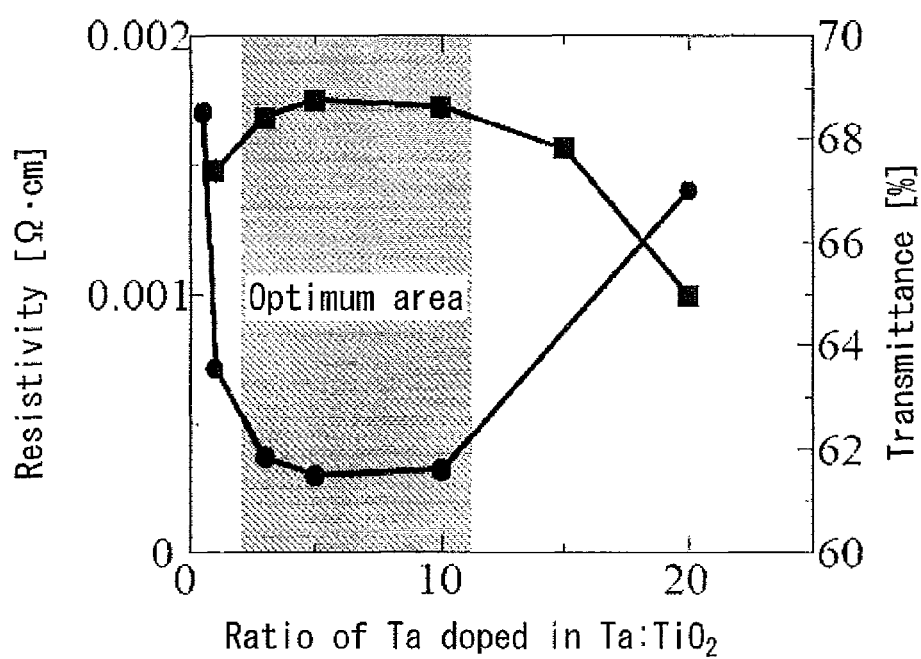
FIG. 17 is a diagram showing the relationship of Ta-doped amount and resistivity/transmittance.

FIG. 17 is a diagram showing the relationship of the amount of Ta doped and the resistivity/transmittance. In FIG. 17, circles represent the resistivities and triangles represent the transmittances. As shown in FIG. 17, a region being of small resistivity and large transmittance is the region of the Ta substitutional rate x being 0.03 or greater and 0.1 or less. Furthermore, a region being of smaller resistivity and larger transmittance is the region of Ta substitutional rate x being 0.05 or greater and 0.1 or less. These regions indicate the optimum area of the amount of Ta doped.

The present invention makes it possible that the transparent metal 1 according to the present invention has resistivity at a level between $10^{-4}$ Ωcm and $10^{-3}$ Ωcm when the Ta substitutional rate x is not only 0.005 or greater and 0.2 or less but is also 0.001 or greater and 0.2 or less.

When the Ta substitutional rate x is 0.01 or greater and 0.05 or less in the metal oxide layer 12, stable and high transmittance is able to be achieved even if in the red region.

When the Ta substitutional rate x is 0.01 or greater and 0.05 or less in the metal oxide layer 12, resistivity is decreased to $5 \times 10^{-4}$ Ωcm at room temperature (280 to 300K) and $5 \times 10^{-5}$ to $2 \times 10^{-4}$ Ωcm at cryogenic temperature (5 to 20K) while stable and high transmittance is achieved even if in the red region.

The present invention makes it possible that the transparent metal 1 according to the present invention has a high transparency and low resistivity almost equal to that of the ITO film in which Ta:TiO$_2$ obtained by substituting Ta for Ti of the anatase TiO$_2$ is used as the metal oxide layer 12.

If the Ta substitutional ratio of the metal oxide layer 12 is controlled so that the resistivity of the metal oxide layer 12 becomes $2 \times 10^{-4}$ to $1.8 \times 10^{-3}$ Ωcm at room temperature or $5 \times 10^{-5}$ to $7 \times 10^{-4}$ Ωcm at cryogenic temperature, it becomes possible to remarkably extend applicability to various devices such as a liquid crystal panel.

If the TiO$_2$ film deposition technique which is applied to a photocatalyst or the like is used, it becomes possible to perform the enlargement of an area and the mass production of the transparent metal 1. Therefore, transparent metal 1 can be applied to an electrode for a solar cell which uses TiO$_2$ as a photocatalyst in addition to application for an electrode of a conventional solar cell. Applying the transparent metal 1 having a low resistivity to a liquid crystal display panel causes reduction of the power consumption of the display device of the liquid crystal display panel, and therefore, enlargement and miniaturization for portability of the liquid crystal display panel can be accelerated. According to the above-described constitution, labor accompanying production is remarkably reduced in addition to cost reduction with facilitation of raw material acquisition and simplification of production processes using the transparent metal 1.

Therefore, when the transparent metal 1 according to the present invention is used as an electrode, a transparent electrode having conventional performance can be produced at a low price and thereby applicability can be extended. Furthermore, since Nb:TiO$_2$, Ta:TiO$_2$, and the like which are not eroded by acid and alkali are used as the metal oxide layer 12 constituting the transparent metal 1, applicability can be extended without the influence of the ambient environment.

In the above embodiment, the substrate 11 on which the metal oxide layer 12 is formed is defined as a transparent metal 1, however, the transparent metal 1 is not limited to this embodiment and the metal oxide layer 12 itself may be defined as a transparent metal 1.

The transparent metal 1 according to the present invention is not limited to the use as an electrode and may be applied to a part, a thin film, a device, or the like which require transparency and high conductivity.

Next, scattering time, effective mass, and the like are explained below

Figure 18A:
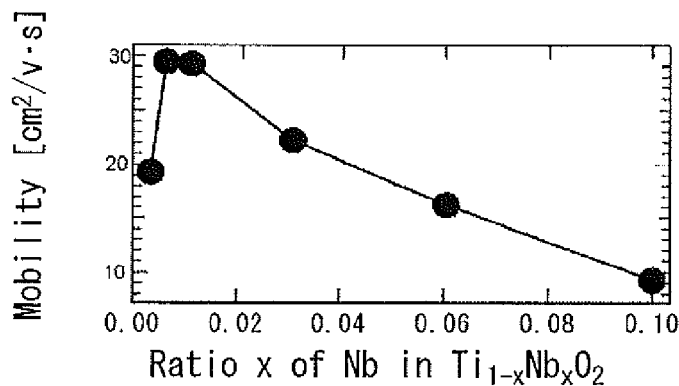
FIG. 18A is a diagram showing a Nb amount dependency to mobility of $Ti_{1-x}Nb_xO_2$ single crystal thin layers at room temperature.
Figure 18B:
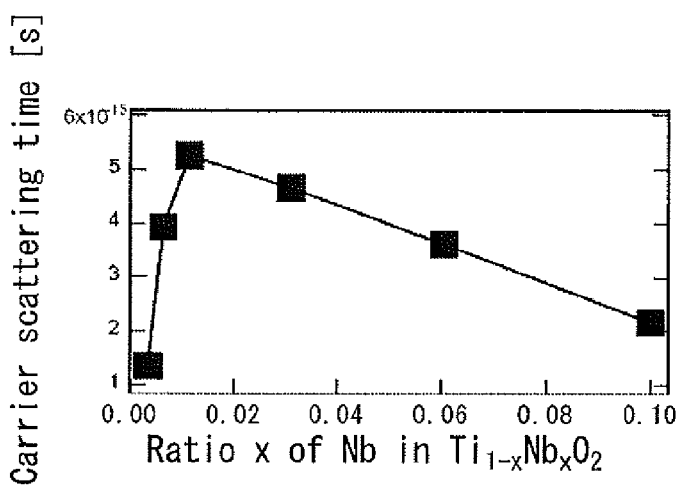
FIG. 18B is a diagram showing a Nb amount dependency to the scattering time of carriers of $Ti_{1-x}Nb_xO_2$ single crystal thin layers at room temperature.
Figure 18C:
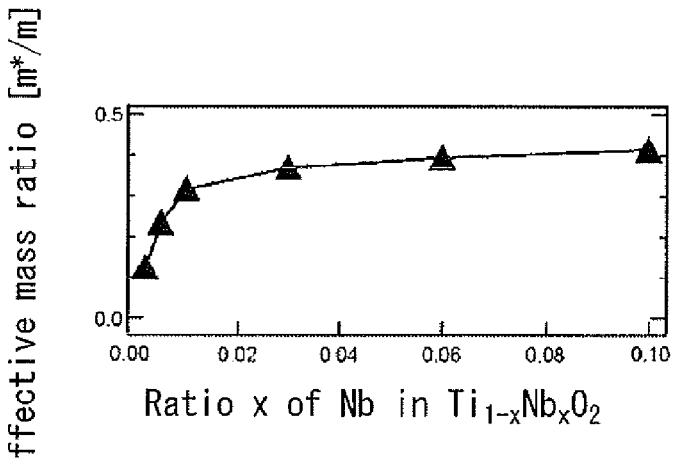
FIG. 18C is a diagram showing a Nb amount dependency to the effective mass of carriers of $Ti_{1-x}Nb_xO_2$ single crystal thin layers at room temperature.
Figure 19:
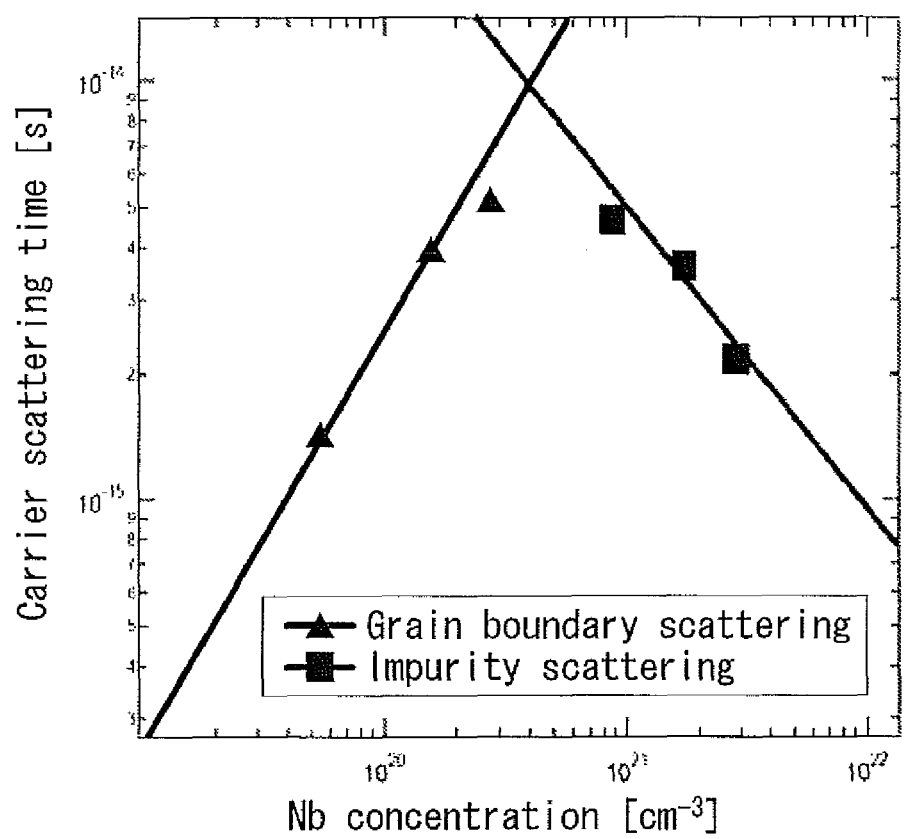
FIG. 19 is a diagram of a log-log graph showing a Nb concentration dependency of scattering time.

FIGS. 18A, 18B, and 18C show the Nb amount dependencies to mobility, scattering time of the carrier, and effective mass of the carrier of Ti$_{1-x}$Nb$_x$O$_2$ single crystal thin film at room temperature. FIG. 19 shows a log-log graph showing a Nb concentration dependency of scattering time.

The scattering (relaxation) time of the carrier rapidly increases with the increase of the Nb amount and gradually decreases from the point that the Nb substitutional amount x has achieved to 0.01. From the results of a ZnO thin film sample which is the same as a transparent conductor, it is considered that grain boundary scattering is dominant in x being less than 0.01 and scattering by neutral/ionized impurities is dominant in x being greater than 0.01 (see FIG. 19). As described above, regarding a sample having satisfactory carriers, since grain boundary scattering can be neglected even if the sample is a polycrystal sample, the polycrystal sample is able to maintain performance almost equal to that of the single crystal sample. This fact is a very advantageous point for developing an organic EL panel, a liquid crystal panel, or the like which necessarily use polycrystal thin films.

The monotonical increase of the effective mass of carrier with the Nb amount suggests the decrease of curvature of the conductive band as the conductive band separates from the minimum of conduction band (variation is smaller than that of scattering time). The absolute value of variation is 0.2 to 0.4 m$_0$ (m$_0$ is the rest mass of an electron) and the value is almost equal to that of SnO$_2$ (0.2 to 0.3 m$_0$) or that of ITO (0.3 m$_0$).

The tendency of mobility reflects the change of the Nb amount of scattering time in general. That is, the transport phenomenon at room temperature strongly depends on the change of a scattering mechanism with Nb addition rather than a band structure.

The vicinity of x being 0.01 to 0.03 is the optimum composition in which both grain boundary scattering and impurity scattering can be suppressed to the minimum.

If metal oxide has the composition of Ti$_{1-x-y}$Nb$_x$Ta$_y$O$_2$, the metal oxide can be sufficiently used until x+y becomes 0.3 by experimentation. As long as it is decided by X-ray measurement, it has been ascertained that x and y can be substituted to 40% (x+y is 0.4 or less). When it is desired that only blue-ultraviolet rays are transmitted even if transparency in the visible light region decreases, the metal oxide having a large substitutional ratio x+y is sufficiently used depending on use such as application to a heat reflecting film and thereby the maximum of x+y when Nb and Ta are mixed becomes larger.

TiO$_2$ film may be provided by applying an oriented film being at least one selected from the group consisting of ZnO, ZrO$_2$, SrTiO$_3$, MgO, LaAlO$_3$, CeO$_2$, ZrO$_2$, and Al$_2$O$_3$ films on a substrate beforehand, and forming a TiO$_2$ film thereon. The oriented film acts as a buffer film (buffer layer). The buffer layer is important to form an anatase type film on glass. Since ZnO is easily oriented, there is an advantage that a ZnO film is easily formed.

V, Mn, Tc, Re, P, Bi, and the like are applicable for using as a dopant which imparts transparent conductivity. All other elements have applicability for use as a dopant imparting transparent conductivity.

Many transparent conductive materials are based on an oxide of Sn, In, or Zn, and oxide thin films such as ITO, SnO$_2$, and ZnO are used as a transparent conductive film. Al or Ga is an effective dopant for a ZnO film. These elements are placed on the right side of the periodic table. It is known that these elements have an electric conduction mechanism based on an s electron or a p electron. On the other hand, in the TiO$_2$ transparent conductor treated in this embodiment, electric conduction is imparted by a d electron, so the conductor is a new type of transparent conductor.

The TiO$_2$ film may be grown on a GaN substrate. The present inventors have found that epitaxial growth of the TiO$_2$ film is performed on the GaN substrate. Concretely, the following composition is considered.

(1) Functional device characterized by comprising $Al_xGa_yIn_zN$ ($0 \leq x \leq 1$, $0 \leq y \leq 1$, and $0 \leq z \leq 1$) and an oxide material formed on the $Al_xGa_yIn_zN$ composed of a metal oxide which is $TiO_2$.

(2) Functional device characterized in that the metal oxide is doped with one or more elements selected from the group consisting of Nb, Ta, Mo, As, Sb, Al, and W.

(3) Functional device characterized in that the metal oxide is doped with one or more elements selected from the group consisting of Co, Fe, Cr, Sn Ni, Mn, and V.

(4) Functional device characterized in that the oxide material is a single-phase film.

(5) Functional device characterized in that the oxide material is an epitaxial film.

The oxide material film may be formed by not only a PLD method, but also another physical vapor deposition (PVD) method such as a molecular beam epitaxy (MBE) method and a sputtering method, or a chemical vapor deposition (CVD) method, for example, a MOCVD method other than the PLD method.

It is considered that the light wavelength expected to be used by optical communication in the near future shifts to a short wavelength region such as blue or ultraviolet rays. In this situation, the oxide material can be used as an optical magnetic device showing a large Faraday rotation coefficient in the vicinity of a wavelength of 400 nm. Especially, since a large Faraday rotation coefficient equal to that of a magnetic garnet film is obtained, an optical isolator suitable for a next generation short wavelength region communication can be prepared using the oxide material.

A use of the oxide material is not limited to use as the optical isolator. The oxide material can be used for a magneto-optical device such as an optical circulator, a variable optical attenuator, an optical communication device, or the like; a magneto-optical device: an optical circuit; a nonreciprocal optical part; a nonreciprocal optical element; a semiconductor laser equipped with an isolator; a current-magnetic field sensor; a magnetic domain observation; a magneto-optical measurement; or the like.

As the optical isolator, typical examples include a module comprising an LD and an isolator to be a unit; an optical isolator for fiber insertion; an optical isolator for an optical amplifier; a deflection-de-pendent type optical isolator; a deflection-independent type optical isolator; and an optical waveguide type optical isolator. As the optical waveguide optical isolator, typical examples include a Mach-Zehnder type branching waveguide isolator and a rib type waveguide isolator.

As the optical circulator, a deflection-dependent type circulator and a deflection-independent type circulator may be used.

By applying $TiO_2$ which is doped with Co or the like to a light emitting device composed of a GaN compound semiconductor, an optical isolator which also corresponds to a short wavelength region such as blue or ultraviolet is able to be achieved. If the optical isolator is formed on the $TiO_2$ film with epitaxial growth, a functional device is monolithically obtained as well as the $TiO_2$ film acts as a buffer for crystal growth. That is, development of a monolithic functional device as well as a highly efficient light emitting device and a display with a low-cost and a large area can be carried out. For example, the fusion of a transparent electrode and an optical device, and the fusion of a light emitting device and a magneto-optical device can be achieved. The oxide material may be used for a light receiving element, a high frequency device such as a HEMT (high electron mobility transistor) or the like, and an electronic device.

Furthermore, applications such as an electrode for a dye sensitized solar cell, a display panel, an organic EL panel, a light emitting element, a light emitting diode (LED), a transparent electrode of white LED or blue laser (film forming on the GaN), a transparent electrode for a vertical cavity surface emitting laser, a lighting device, a communication device, and an application that only blue light is made to transmit can be also suggested. The transmittance is preferably 90% or greater in the visible light region and a long wavelength red light region may be filtered to pass only blue light. The thin layer doped with a large amount of Nb is effective in this case. It is not essential that transmittance becomes 90% or greater. The doping amount of Nb or the like is simply adjusted in accordance with the application or a balance between resistivity and transmittance.

When film forming is carried out on the GaN compound, there is an advantage that the refractive index matching is carried out, and thereby improving light-extraction efficiency The GaN compound may include not only GaN but also GaN with a small amount of dopant.

In more detail, the following are examples for use of the transparent metal 1 according to the present invention. Examples include a transparent conductive film on a liquid crystal display (LCD), a transparent conductive film on a color filter part, a transparent conductive film on an electro luminescence (EL) display, a transparent conductive film on a plasma display panel (PDP), a PDP optical filter, a transparent conductive film for blocking electromagnetic waves, a transparent conductive film for blocking a near infrared ray, a transparent conductive film for preventing surface reflection, an optical filter, a touch panel, a resistive type touch panel, an electromagnetic induction type touch panel, an ultrasonic type touch panel, an optical touch panel, an electrical capacitance type touch panel, a resistive type touch panel for personal digital assistants, a touch panel unified with a display (inner touch panel), a solar cell, an amorphous (a-Si) solar cell, a microcrystalline Si thin film solar cell, a CIGS solar cell, a dye sensitized solar cell (DSC), a transparent conductive material for preventing static electricity of electronic parts, a transparent conductive material for preventing electrification, a photochromic material, a photochromic mirror, a heating unit (a surface heater and an electrothermal glass), and a glass for blocking electromagnetic wave.

The present invention is explained above referring to the specific embodiments. However, it is obvious for a person having ordinary skill in the art to perform corrections or substitutions of the embodiments without departing from the spirit or scope of the present invention. That is, it should be understood that the embodiments are exemplary of the invention and are not to be considered as limiting. The claims should be considered in order to determine the scope of the invention.

It is clear that the embodiments for explanation of the invention achieve the above-described object, and similarly, it should be understood that many modifications or other examples can be made by a person having ordinary skill in the art. Any elements or components described in the claims, specification, drawings, or embodiment for explanation may be adopted with each other or in another combination. Claims are intended to modify as described above and to adopt other embodiments, and such are included in the technical idea and technical scope of the present invention.

INDUSTRIAL APPLICABILITY

According to the present invention, a substrate for transparent electrode having transparency and conductivity is achieved and the substrate is able to be applied in various uses.

The invention claimed is:

1. A transparent conductor comprising a metal oxide which is $M:TiO_2$ comprising an anatase type crystal structure, wherein M is selected from the group consisting of Nb and Ta and the transparent conductor has an electric resistivity of $10^{-3}$ Ωcm or less.

2. A transparent conductor according to claim 1, wherein the metal oxide is provided on a perovskite type crystal substrate.

3. A transparent electrode comprising the transparent conductor according to claim 1.

4. A transparent conductor according to claim 1, wherein the metal oxide is disposed on a GaN compound film.

5. A transparent conductor according to claim 1, wherein the metal oxide is disposed on an oriented film which is disposed on a substrate.

6. A transparent conductor according to claim 5, wherein the oriented film is at least one selected from the group consisting of ZnO, $ZrO_2$, $SrTiO_3$, MgO, $LaAlO_3$, $CeO_2$, $ZrO_2$, and $Al_2O_3$ films.

7. A transparent conductor according to claim 5, wherein the oriented film is a ZnO film.

8. A transparent conductor according to claim 1, wherein a d electron imparts electric conductivity.

9. A solar cell comprising the transparent conductor according to claim 1.

10. A light emitting device comprising the transparent conductor according to claim 1.

11. A display panel comprising the transparent conductor according to claim 1.

* * * * *